United States Patent [19]

Hammer, Jr.

[11] 4,233,123
[45] Nov. 11, 1980

[54] METHOD FOR MAKING AN AIR COOLED COMBUSTOR

[75] Inventor: Ganz G. Hammer, Jr., Speedway, Ind.

[73] Assignee: General Motors Corporation, Detroit, Mich.

[21] Appl. No.: 970,630

[22] Filed: Dec. 18, 1978

[51] Int. Cl.² .................... G03C 5/00; G03C 11/00; C25F 3/02

[52] U.S. Cl. .................... 204/129.65; 60/722; 156/664; 156/659.1; 430/323; 430/320; 204/129.43

[58] Field of Search ............. 355/47; 96/36, 37, 38, 96/227 R; 156/645, 659, 664; 355/47; 60/39.65, 39.66; 204/129.43, 129.65

[56] References Cited

U.S. PATENT DOCUMENTS

| | | | |
|---|---|---|---|
| 2,166,367 | 7/1939 | Norris | 96/38.2 |
| 2,182,559 | 12/1939 | Henderson | 96/37 X |
| 2,317,551 | 4/1943 | Ormond | 156/659 |
| 2,373,087 | 4/1945 | Alger | 96/37 X |
| 2,662,455 | 12/1953 | Freund | 96/37 X |
| 3,610,143 | 10/1971 | Greenwood | 96/37 X |
| 3,735,589 | 5/1973 | Caruel et al. | 60/39.65 |
| 3,737,152 | 6/1973 | Wilson | 60/39.66 |
| 4,038,040 | 7/1977 | Nagl | 156/659 X |
| 4,059,479 | 11/1977 | Tanazawa | 156/659 X |
| 4,151,040 | 4/1979 | Schiffman | 156/659 |

Primary Examiner—Edward C. Kimlin
Attorney, Agent, or Firm—J. C. Evans

[57] ABSTRACT

A method for making an air cooled combustor of the slot film cooled type including artificially roughened convective channels to cool the liner wall components of a combustor for a gas turbine engine including the steps of: preforming a combustor wall segment having a curved surface thereon for directing cooling air from exteriorly of the combustor across inner wall surfaces thereof; coating the curved surface with photosensitive material; preparing a phototransparency having a crosshatch grid thereon of continuously curved intersecting lines and thereafter projecting the crosshatch grid pattern against the photosensitive material on the conical surface to produce an exposed, uniform straight line grid pattern on the photosensitive material and thereafter photoetching the uniform straight line pattern into the metal of the surface to produce a uniform array of raised lands across the curved surface of the wall segment for producing a uniform cooling of the portions thereof having convective air flow thereacross.

1 Claim, 5 Drawing Figures

METHOD FOR MAKING AN AIR COOLED COMBUSTOR

This invention relates to the manufacture of wall cooled gas turbine engine combustor assemblies and to arrangements for producing an improved flow of coolant air from exteriorly of the combustor through wall slot configurations either having convective channels formed therein or roughened internal surfaces thereon to improve heat transfer between air flow through the convective channels and wall segments of the combustor.

It is recognized that the provision of artificially roughened convective channels in air cooled liner walls can produce liner cooling flow requirements without sacrificing durability. Examples of such convective flow channels are set forth in U.S. Pat. No. 3,706,270, issued Dec. 19, 1972, to Goldberg et al; U.S. Pat. No. 3,735,589, issued May 29, 1973, to Caruel et al, and in U.S. Pat. No. 3,737,152, issued June 5, 1973, to Wilson.

Such arrangements include provision for shaping or drilling segments of a liner wall to obtain coolant flows therethrough of reduced amounts as well as to maintain the wall segments thereof cooled by air flow therethrough.

An object of the present invention is to provide an improved method of manufacture of combustor wall segments arrangement for maintaining a uniform array of roughened surface lands on the facing portions of liner walls at a coolant flow slot therethrough to improve cooling of liner wall segments without unnecessarily increasing coolant flow rates during combustor apparatus operation.

More particularly, an object of the present invention is to provide an improved method for fabricating a gas turbine engine combustor wall having curved surfaces thereon for flow of cooling air as a film across the inner wall surfaces of a downstream wall portion of the combustor wherein an annular metal ring wall segment is preformed to have a curved surface thereon coated with photosensitive material and including the steps of preparing a transparency having a crosshatch grid thereon of continuously curved intersecting lines which is thereafter projected onto the curved surface to produce an exposed pattern of a plurality of uniform straight lines thereon which is thereafter photoetched to form a plurality of raised lands of uniform shape across the full extent of the curved surface thereby to produce a uniform surface scrubbing action as cooling air flow passes thereacross.

Further objects and advantages of the present invention will be apparent from the following description, reference being had to the accompanying drawings wherein a preferred embodiment of the present invention is clearly shown.

Figure 1:
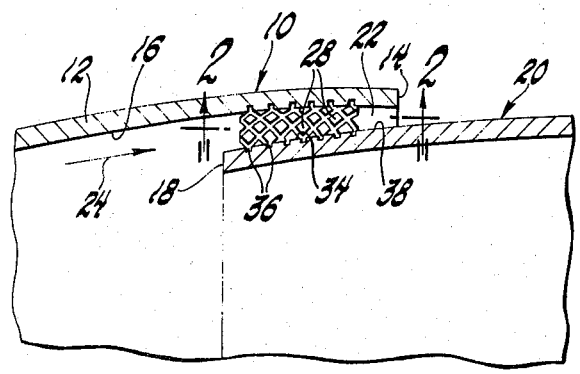
FIG. 1 is a fragmentary cross-sectional view of a coolant film slot in a combustor constructed in accordance with the present invention.
Figure 2:
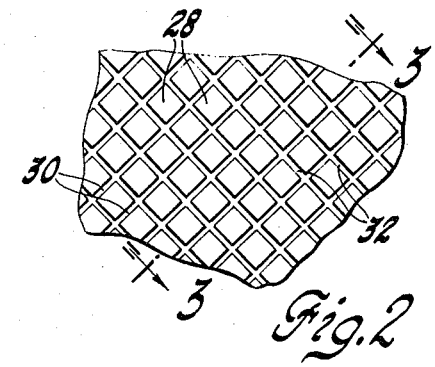
FIG. 2 is a fragmentary, enlarged elevational view looking in the direction of the arrows 2—2 in FIG. 1.

Referring now to the drawings, in FIG. 1, a fragment of a combustor 10 for a gas turbine engine is illustrated including an upstream annular wall segment 12 having a downstream end 14 thereon and an inner annular surface 16 which is located in overlying relationship to the inlet edge 18 of a downstream annular wall segment 20. A slot 22 is formed between the trailing end 14 and the inlet end 18 of the wall segment 20 through which coolant air flow represented by the arrow 24 is directed from exteriorly of the combustor 10 into a reaction zone 26 located and defined internally of the wall segments 12, 20. To improve the effectiveness of coolant air flow 24 through the slot 22 the inner surface 16 is fabricated by an improved method to form a plurality of raised lands 28 thereon of uniform shape and height and separated from one another by a plurality of straight line grooves 30 running in one direction across the inner wall 16 and straight line grooves 32 running perpendicular to the grooves 30 as shown in FIG. 2. This roughened surface configuration produces uniform surface scrubbing of the liner wall segment 12 immediately upstream of the end 14 to remove heat from the wall segment 10 during combustor operation. The wall segment 20 also includes a plurality of raised lands 34 thereon of uniform shape and height separated from one another by a plurality of straight line grooves 36 formed in the inner surface 38 of the wall segment 20. The lands 34 are, in the illustrated embodiment, of the same form as that shown in FIGS. 2 and 3 and are located in facing relationship to the lands 28 shown on the wall segment 12 for producing a uniform surface scrubbing action of the liner wall 20 at the inlet end 18 thereof to produce an improved cooling of the wall segment 20 of the combustor 10 as cooling air flow is directed thereacross.

Figure 3:
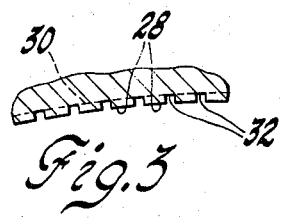
FIG. 3 is a cross-sectional view taken along the line 3—3 of FIG. 2.
Figure 4:
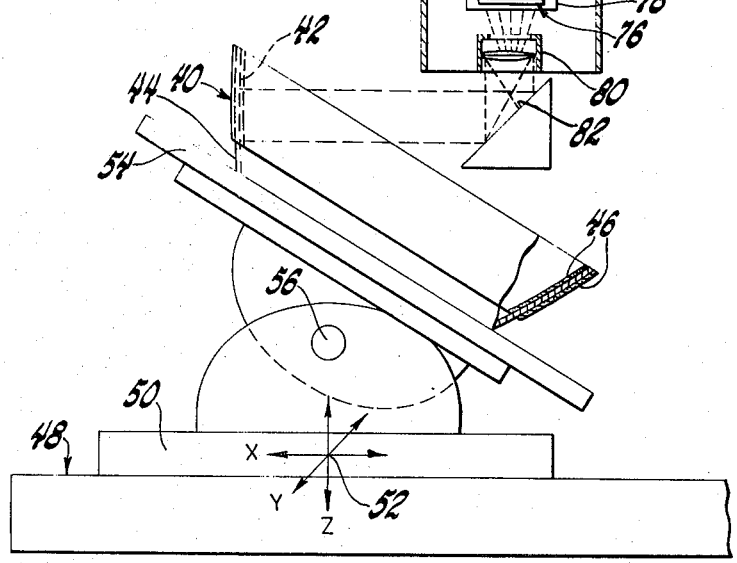
FIG. 4 is an apparatus utilized to fabricate the gas turbine engine combustor in accordance with the method of the present invention.

The aforesaid structure in FIGS. 1 through 3 is formed in accordance with the present invention by the steps of first preforming as annular metal part 40 shown diagrammatically in FIG. 4 as including a curved surface 42 of concave form on the inner surface thereof and an annular convex surface 44 on the exterior thereof. The surface 42, in the illustrated arrangement, diagrammatically represents the surface 16 in the illustration in FIG. 1 and the convex surface 44 represents the curved surface 38 of the liner wall segment 20 in FIG. 1.

Following preforming of the annular metal part 40 with the surfaces 42, 44 thereon, the metal part is degreased with a suitable solvent such as trichloroethylene or perchloroethylene. The part is then scrubbed with a cleaner and brush to remove foreign material therefrom. Alkaline salts are suitable cleaners. The part is then electro-cleaned at 100 amps (cathodic) for five minutes and rescrubbed with a cleaner and brush.

Thereafter the part is rinsed in cold water and subjected to an acid etch in a solution of 5 ounces (0.15 liters) of chromic acid per gallon (3.78 liters) of water at 130° F. (39° C.) for five minutes. Thereafter the piece is rinsed in cold water and blown dry.

The cleaned part is then dipped in a photoresist material such as AZ119S, a positive photoresist composition manufactured by Shipley Company. A paste is formed of 5 parts of AZ119S for 2 parts of water. The coating is shown at 46 in FIG. 4 and is approximately 0.0004 inches thick. The part is then transferred under condition of no white light exposure to a rack support for the part and set in a drying cabinet for five minutes under ambient conditions. This allows the photo-resist material to partially set and thereafter the part along with the photo-resist coating 46 thereon is placed in an oven on a rack and dried at 175° F. (66° C.) for forty-five minutes. The part is then cooled to ambient temperature conditions. All this is done out of presence of white light.

The coated part 40 is then placed on an adjustable table 48 which includes a movable platform 50 that is adjustable in XY and Z planes represented by the reference numeral 52 in FIG. 4. Additionally, the table 48 includes a rotating and angle adjustment head 54 that is angularly adjusted about a pivot 56 to adjust the curved surface 42 with a coating 46 thereon with respect to a projector 58 that is utilized to produce a step and repeat projection of a pattern on the photo-resist layer 46 in accordance with the method of the present invention.

More particularly, the projector 58 includes a cooling fan 60, a lamp 62 and a spherical light collector 64 that focuses light through a heat absorbing lens 66 and a lens combination 68 to a shutter 70 that is diagrammatically illustrated as intercepting the focused light from the lens 68.

During a projection step the shutter 70 is conditioned to open an aperture 72 in alignment with a condenser lens 74 which directs light through a slide transparency 76 constructed in accordance with the present invention and supported by a holder 78 above a projector lens 80 that directs light against a 45° mirror 82 thereby to be projected laterally as shown in the arrangement in FIG. 4 against the curved surface 42 with photo-resist coating 46 which is shaped corresponding as the curved surface 42.

Figure 5:
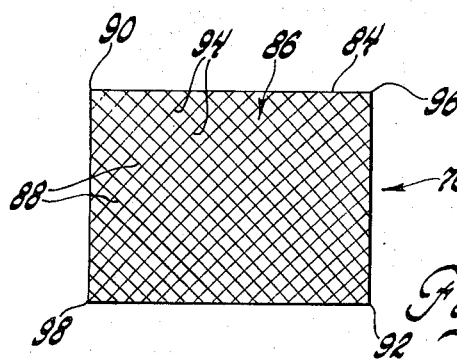
FIG. 5 is a diagrammatic view of a transparency of curved grid pattern used in the apparatus of FIG. 4 while practicing the method of the present invention.

The slide transparency 76 has a border 84 and a black line crosshatch grid 86 thereon as shown in FIG. 5. More particularly, the grid 86 is made up of a plurality of continuously curved lines 88 running diagonally from the upper corner 90 to the lower corner 92 of the slide 76 as shown in FIG. 5 and a second plurality of curved lines 94 which run between the opposite diagonal corners 96, 98 of the slide 76. This grid pattern is preselected and configured so that the slightly curved lines 88, 94 will project from the mirror 82 against the curvature of the surface 42 to define a plurality of uniform diamond shaped lands exposed into the material of coating 46 and corresponding to lands 28 or 34 in the apparatus of FIGS. 1 through 3 with straight line grooves therebetween.

Following the exposure of the photo-resist layer 46 the method includes developing the photo-resist material for five minutes in a suitable developer solution such as one part per volume of Shipley AZ-303A to two parts of volume water. Thereafter the photo-resist layer is rinsed with water for two minutes at 175° F. (66° C.). Thereafter it is air dried for approximately five minutes. The piece is then baked at 300° F. for thirty minutes and all areas of the photo-resist that are not to be removed by photoetching are masked by use of a suitable acid resistant material such as a polyester tape.

The part 40 and the exposed material thereon is then placed in an etching rack and attached thereto by suitable clamping means. The part is then placed in the etch tank filled with a solution of three gallons (11.4 liters) concentrated sulphuric acid; two gallons (7.6 liters) concentrated phosphoric acid; three gallons (11.4 liters) water and 2.5 pounds (1.14 kilograms) chromium trioxide at 150° F. (51° C.). The part is placed in the center of an OD anode and leads are attached to the part 40 and to the electrodes.

An electroetch is then conducted with thirty second anodic and four second cathodic current reversal at 25 amps for one hour; 40 amps for one-half hour and 75 amps for one hour.

The part is then removed and spray rinsed, followed by a cold rinse, hot rinse and blow dried and then unracked. The part is then stripped of tape and immersed partly in a caustic strip for ten minutes and then the resist material is brush loosened from the part 40.

Thereafter, the part is again rinsed with a cold water rinse and hot water rinse and blow dried to result in the structure shown in FIGS. 1 through 3.

While the embodiments of the present invention, as herein disclosed, constitute a preferred form, it is to be understood that other forms might be adopted.

The embodiments of the invention in which an exclusive property or privilege is claimed are defined as follows:

1. A method for fabricating a gas turbine engine combustor wall having a curved surface thereon for flow of cooling air film across the inner wall surfaces of a downstream wall portion of a combustor comprising the steps of: preforming an annular metal part having a curved end surface, coating said surface with photoresist material, preparing a transparency having a crosshatch grid thereon of continuously curved intersecting lines selected to correspond to the curvature of said end surface to project as a straight line grid thereon, positioning the surface and coated photoresist material thereon on an adjustable work platform, projecting the crosshatched curved grid pattern from said transparency against the photoresist material through an angle to cause the curved grid pattern lines of the phototransparency to be exposed as a uniform straight line grid pattern on the photoresist material, developing the exposed straight line grid pattern on the photoresist material, masking all areas of the coated curved surface except the exposed straight line grid pattern thereon, and thereafter etching the uniform straight line pattern into metal of the curved end surface to produce a uniform pattern of raised lands with straight edges across the curved end surface of the annular metal part for producing a uniform surface scrubbing action and cooling of the metal part during flow of the air film thereacross.

* * * * *